(12) United States Patent
Elam et al.

(10) Patent No.: US 10,553,874 B2
(45) Date of Patent: Feb. 4, 2020

(54) PROTECTIVE COATINGS FOR LITHIUM ANODES

(71) Applicant: UCHICAGO ARGONNE, LLC, Chicago, IL (US)

(72) Inventors: Jeffrey W. Elam, Elmhurst, IL (US); Lin Chen, Westmont, IL (US)

(73) Assignee: UChicago Argonne, LLC, Chicago, IL (US)

( * ) Notice: Subject to any disclaimer, the term of this patent is extended or adjusted under 35 U.S.C. 154(b) by 25 days.

(21) Appl. No.: 15/669,771

(22) Filed: Aug. 4, 2017

(65) Prior Publication Data

US 2019/0044151 A1 Feb. 7, 2019

(51) Int. Cl.
| | |
|---|---|
| *H01M 4/04* | (2006.01) |
| *H01M 4/62* | (2006.01) |
| *C23C 16/455* | (2006.01) |
| *C23C 16/22* | (2006.01) |
| *H01M 4/36* | (2006.01) |
| *H01M 4/38* | (2006.01) |
| *H01M 4/1395* | (2010.01) |
| *H01M 4/02* | (2006.01) |
| *B05D 7/00* | (2006.01) |
| *C23C 16/40* | (2006.01) |

(52) U.S. Cl.
CPC ............. *H01M 4/628* (2013.01); *C23C 16/22* (2013.01); *C23C 16/45527* (2013.01); *H01M 4/0423* (2013.01); *H01M 4/1395* (2013.01); *H01M 4/366* (2013.01); *H01M 4/382* (2013.01); *B05D 7/50* (2013.01); *B05D 7/56* (2013.01); *C23C 16/40* (2013.01); *H01M 2004/027* (2013.01)

(58) Field of Classification Search
CPC ... C23C 16/22; C23C 16/40; C23C 16/45527; H01M 4/628; H01M 4/0423; H01M 4/1395; H01M 4/366; H01M 4/382; H01M 2004/027
USPC ............ 427/58, 115, 255.19, 255.34; 429/40
See application file for complete search history.

(56) References Cited

U.S. PATENT DOCUMENTS

| | | | |
|---|---|---|---|
| 4,009,052 A | 2/1977 | Whittingham | |
| 8,535,832 B2 * | 9/2013 | Karthikeyan | ......... H01M 4/366 252/182.1 |
| 2004/0072066 A1 | 4/2004 | Cho et al. | |
| 2013/0177808 A1 * | 7/2013 | Wang | .................... C23C 16/402 429/219 |

(Continued)

FOREIGN PATENT DOCUMENTS

| | | | |
|---|---|---|---|
| WO | WO2016/057426 | * | 4/2016 |
| WO | WO-2016/057426 | | 4/2016 |

OTHER PUBLICATIONS

Aurbach, et al., "A short review of failure mechanisms of lithium metal and lithiated graphite anodes in liquid electrolyte solutions," Solid State Ionics 148(3-4), pp. 405-416 (2002), no month available.

(Continued)

*Primary Examiner* — Brian K Talbot
(74) *Attorney, Agent, or Firm* — Foley & Lardner LLP (57) ABSTRACT

A hybrid protective coating includes an inorganic component and an organic component such that the inorganic component includes at least one of a metal oxide, a metal fluoride, or combination thereof, and the organic component includes at least one metalcone.

9 Claims, 8 Drawing Sheets

(56) References Cited

U.S. PATENT DOCUMENTS

| | | | | |
|---|---|---|---|---|
| 2013/0337259 A1* | 12/2013 | Carcia | .................. | C09D 5/00 |
| | | | | 428/336 |
| 2015/0180023 A1* | 6/2015 | Xiao | .................. | H01M 4/366 |
| | | | | 429/231 |
| 2015/0364747 A1* | 12/2015 | Elam | .................. | H01M 4/0426 |
| | | | | 204/192.1 |
| 2016/0351973 A1* | 12/2016 | Albano | .................. | H01M 4/366 |
| 2017/0263935 A1* | 9/2017 | Kozen | .................. | H01M 4/134 |

OTHER PUBLICATIONS

Aurbach, et al., "The Study of Surface Phenomena Related to Electrochemical Lithium Intercalation into Lix MOy Host Materials (M=Ni, Mn)," Journal of the Electrochemical Society 147(4), pp. 1322-1331 (2000), no month available.

Kozen, et al., "Next-Generation Lithium Metal Anode Engineering via Atomic Layer Deposition," ACS Nano 9(6), pp. 5884-5892 (2015), no month available.

Shin, et al., "Comparison of Solvent-Cast and Hot-Pressed P(EO)20LiN(SO2CF2CF3)2 Polymer Electrolytes Containing Nanosized SiO2," Journal of the Electrochemical Society 152(2), pp. A283-A288 (2005), no month available.

Shin, et al., "PEO-Based Polymer Electrolytes with Ionic Liquids and Their Use in Lithium Metal-Polymer Electrolyte Batteries," Journal of the Electrochemical Society 152(5), pp. A978-A983 (2005), no month available.

Whittingham, "Electrical Energy Storage and Intercalation Chemistry," Science 192(4244), pp. 1126-1127 (1976), no month available.

Zheng, et al., "Interconnected hollow carbon nanospheres for stable lithium metal anodes," Nature Nanotechnology 9, pp. 618-623 (2014), no month available.

* cited by examiner

PROTECTIVE COATINGS FOR LITHIUM ANODES

STATEMENT OF GOVERNMENT INTEREST

The United States Government claims certain rights in this invention pursuant to Contract No. DE-AC02-06CH11357 between the U.S. Department of Energy and U. Chicago Argonne, LLC, as operator of Argonne National Laboratory.

FIELD OF THE INVENTION

The present disclosure generally relates to protective coatings for lithium anodes and method of fabrication thereof. Specifically, the present disclosure relates to protective coatings and methods for protecting lithium metal anodes used in secondary (rechargeable) lithium batteries.

BACKGROUND

This section is intended to provide a background or context to the invention recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Lithium (Li) is an attractive anode material with an extremely high capacity (3860 mA·h·g$^{-1}$) and the lowest known negative potential (−3.040 V versus the standard hydrogen electrode). Problems arise, however, with dendrite formation during electrochemical cycling of the Li metal, which causes severe capacity fade and cell failure due to electrical shorting or electrolyte consumption. This long-standing problem has prevented the incorporation of Li anodes in commercial rechargeable cells because the useful lifetime of a Li battery (i.e. the number of times the battery can be charged) is unacceptably low.

Conventional technologies to prevent lithium dendrite growth have focused on improving stability of in-situ formed solid electrolyte interphase (SEI) layers through electrolyte additives, or by applying ex-situ (i.e. artificial) SEI layers to the lithium metal using physical vapor deposition (PVD) or chemical vapor deposition (CVD) methods that produce non-uniform coatings prone to pinholes and other defects. To compensate for these defects, thicker coatings are generally used (i.e. 10-100 μm); however, these thicker coatings increase cell impedance and reduce gravimetric and volumetric capacity.

Thus, a need exists for improved technology, including protective coatings for lithium anodes and methods of fabrication thereof.

SUMMARY

In one embodiment, a method for forming protective coatings on lithium (Li) anodes, comprises (a) reacting a Li surface with an aluminum-containing precursor to form a first monolayer, (b) purging excess aluminum-containing precursor and reaction by-product, (c) reacting the first monolayer with an oxygen-containing precursor, (d) purging excess oxygen-containing precursor and reaction by-product, such that steps (a) to (d) constitute one cycle, and at least two cycles are performed to form the protective coating of a predetermined thickness, and the oxygen-containing precursor is independently selected in each cycle.

In one embodiment, the aluminum-containing precursor comprises at least one of trimethylaluminum (Al(CH$_3$)$_3$) (TMA), triethylaluminum ((C$_2$H$_5$)$_3$Al) (TEA), triethyl(tri-sec-butoxy)dialuminum ((C$_2$H$_5$)$_3$Al$_2$(OC$_4$H$_9$)$_3$), aluminum chloride (AlCl$_3$), aluminum isopropoxide (Al((OCH(CH$_3$)$_2$)$_3$), dimethylaluminum isopropoxide ((CH$_3$)$_2$AlOCH(CH$_3$)$_2$), tris(2,2,6,6-tetramethyl-3,5-heptanedionato)aluminum (Al(TMHD)$_3$), tri-isobutylaluminum ((C$_4$H$_9$)$_3$Al), aluminum hexafluoroacetylacetonate (Al(CF$_3$COCHCOCF$_3$)$_3$), aluminum ethoxide (Al(OC$_2$H$_5$)$_3$), aluminum s-butoxide (Al(OC$_4$H$_9$)$_3$), or aluminum acetylacetonate (Al(CH$_3$COCHCOCH$_3$)$_3$). In one embodiment, the oxygen-containing precursor comprises at least one of water (H$_2$O), ozone (O$_3$), oxygen (O$_2$), ethylene glycol (HOCH$_2$CH$_2$OH), or HO(CH$_2$)$_n$OH, where n is an integer in the range of 3 to 10. In one embodiment, an even number of cycles are performed. In one embodiment, the oxygen-containing precursor of each odd cycle comprises at least one of water (H$_2$O), ozone (O$_3$), or oxygen (O$_2$) and wherein the oxygen-containing precursor of each even cycle comprises ethylene glycol (HOCH$_2$CH$_2$OH) or HO(CH$_2$)$_n$OH, where n is an integer in the range of 3 to 10.

In one embodiment, the oxygen-containing precursor of each odd cycle comprises ethylene glycol (HOCH$_2$CH$_2$OH) or HO(CH$_2$)$_n$OH, where n is an integer in the range of 3 to 10, and wherein the oxygen-containing precursor of each even cycle comprises at least one of water (H$_2$O), ozone (O$_3$), or oxygen (O$_2$). In one embodiment, the protective coating has a thickness in the range of 1 nm to 10 nm. In one embodiment, a hybrid protective coating for lithium (Li) anodes comprising an organic material and an inorganic material. In one embodiment, the organic material includes alucone and the inorganic material includes alumina or lithium-doped alumina. In one embodiment, the organic material includes zincone and the inorganic material includes zinc oxide or lithium-doped zinc oxide.

In one embodiment, a method for forming an inorganic-organic hybrid protective coating on lithium (Li) anodes comprises (a) reacting a Li surface with a first metal-containing precursor to form a first monolayer, (b) purging excess first metal-containing precursor and reaction by-product, (c) reacting the first monolayer with an oxygen-containing precursor or fluorine-containing precursor to form a metal oxide monolayer or metal fluoride monolayer, and (d) purging excess oxygen-containing precursor or fluorine-containing precursor and reaction by-product, such that steps (a) to (d) constitute one inorganic cycle and the inorganic cycle is repeated n times where n is a non-negative integer, (e) reacting the metal oxide monolayer or the metal fluoride monolayer with a second metal-containing precursor to form a second monolayer, (f) purging excess second metal-containing precursor and reaction by-product, (g) reacting the second monolayer with ethylene glycol precursor or HO(CH$_2$)$_x$OH precursor, where x is an integer in the range of 3 to 10, and (h) purging excess ethylene glycol precursor or HO(CH$_2$)$_x$OH precursor and reaction by-product, such that steps (e) to (h) constitute one organic cycle and the organic cycle is repeated m times where m is a positive integer.

In one embodiment, steps (a) to (h) constitute one inorganic-organic cycle and the inorganic-organic cycle is repeated a plurality of times, and wherein the value of n, the value of m, and any precursor is independently determined in each inorganic-organic cycle. In one embodiment, a hybrid protective coating comprises an inorganic component and an organic component, such that the inorganic component includes at least one of a metal oxide, a metal fluoride, or combination thereof, and the organic component includes at least one metalcone. In one embodiment, the at least one metalcone does not include any metals of the inorganic component.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The disclosure will become more fully understood from the following detailed description, taken in conjunction with the accompanying figures, in which:

FIGS. 3A(a)-3B. Coulombic efficiency (CE) and voltage profile of Li metal stripping/plating on Cu as the working electrode. FIG. 3A(a) illustrates CE of Li electrodeposition on Cu with 20 µL ether electrolyte at 0.4 mA/cm$^2$; FIG. 3A(b) illustrates CE of Li electrodeposition on Cu with 20 µL ether electrolyte at 1.0 mA/cm$^2$; FIGS. 3C-3F. Cycling stability of Li electrodeposition in symmetric cells and SEM characterization. FIGS. 3G-3J. Electrochemical measurements of Li—S batteries with controlled electrolyte volume.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

The present disclosure discloses a new method for forming hybrid protective coatings for lithium anodes that are substantially pinhole- and defect-free such that nanometer thickness coatings provide effective protection, and consequently the effects on impedance and gravimetric/volumetric capacity are minimal. Moreover, the protective Li coatings are compatible with both liquid and solid state electrolytes.

In one embodiment, a lithium surface may be coated with "artificial SEI" (i.e. a thin film having desired interfacial, electrical, and mechanical properties) to inhibit dendrites without sacrificing performance. The artificial SEI thin films may be hybrid organic-inorganic coatings that stabilize the lithium metal surface and improve cyclability. In one embodiment, these coatings are deposited layer-by-layer to yield ultrathin, defect free films. Moreover, electrical and mechanical properties, such as ionic conductivity and shear modulus, respectively, are dynamically tuned during growth. In one embodiment, dynamic tuning may be accomplished by alternating between ALD cycles to deposit an inorganic material (e.g. aluminum oxide) and MLD cycles to deposit a hybrid organic-inorganic material (e.g. alucone). By adjusting the relative number of ALD and MLD cycles performed, material properties can be tuned between those of the pure inorganic material and the pure organic-inorganic hybrid material.

Figure 1A:
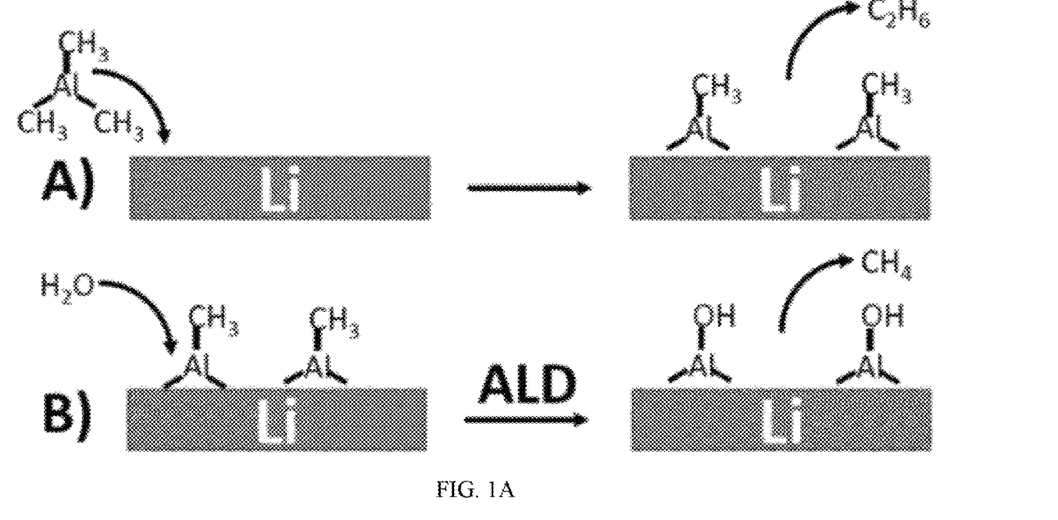
FIG. 1A is a schematic illustration of an atomic layer deposition (ALD) process, according to one embodiment of the present disclosure.

FIG. 1A describes a component of the deposition mechanism, according to one implementation. Described generally, atomic layer deposition (ALD) processes often comprise two half-reactions, whereby precursor materials for each half-reaction are kept separated throughout the coating process. ALD film growth is based on self-limiting surface reactions, which makes achieving atomic scale deposition control possible. In a first half-reaction, a precursor gas is introduced to a substrate surface and produces a first monolayer. Excess or unreacted species and/or reaction by-product from the first half-reaction may be purged from the substrate surface by flow of inert gas (e.g. nitrogen or argon), vacuum evacuation, or other similar removal techniques. A second precursor gas is then introduced to the substrate surface and reacts with the first monolayer to produce a monolayer of film on the substrate surface.

In a first step of the ALD process of FIG. 1A, a lithium surface reacts with a first, aluminum-containing precursor to form a first monolayer. In one embodiment, the aluminum-containing precursor may be trimethylaluminum ($Al(CH_3)_3$) (TMA). In other embodiments, the aluminum-containing precursor may comprise at least one of triethylaluminum (($C_2H_5)_3Al$) (TEA), triethyl(tri-sec-butoxy)dialuminum (($C_2H_5)_3Al_2(OC_4H_9)_3$), aluminum chloride ($AlCl_3$), aluminum isopropoxide ($Al((OCH(CH_3)_2)_3)$), dimethylaluminum isopropoxide (($CH_3)_2AlOCH(CH_3)_2$), tris(2,2,6,6-tetramethyl-3,5-heptanedionato)aluminum ($Al(TMHD)_3$), tri-isobutylaluminum (($C_4H_9)_3Al$), aluminum hexafluoroacetylacetonate ($Al(CF_3COCHCOCF_3)_3$), aluminum ethoxide ($Al(OC_2H_5)_3$), aluminum s-butoxide ($Al(OC_4H_9)_3$), or aluminum acetylacetonate ($Al(CH_3COCHCOCH_3)_3$). After formation of the first monolayer, excess aluminum-containing precursor and reaction by-product is purged from the system.

Figure 1B:
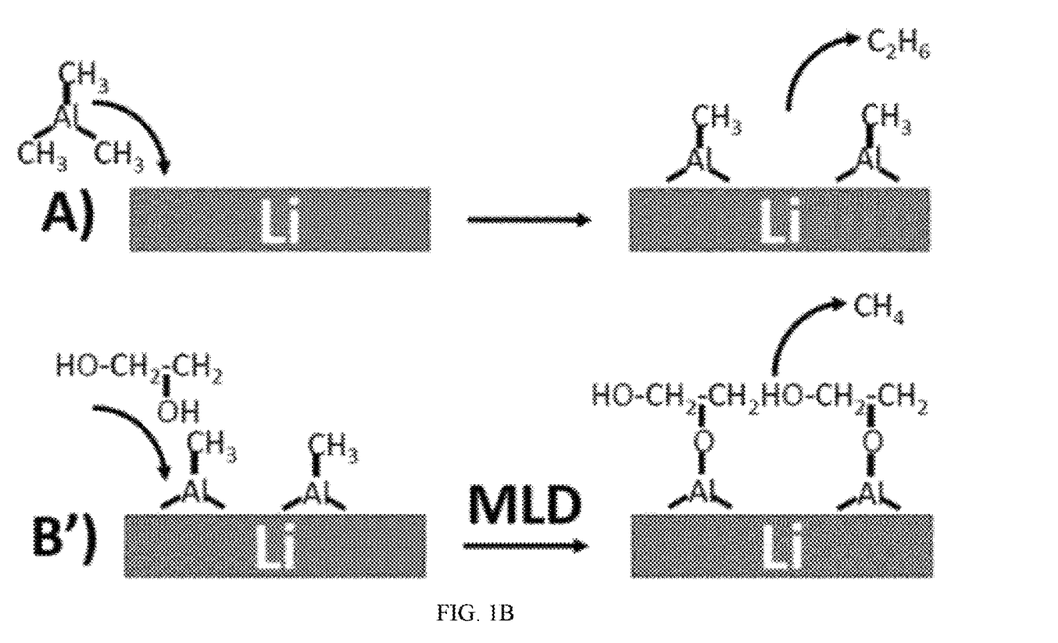
FIG. 1B is a schematic illustration of a molecular layer deposition (MLD) process, according to one embodiment of the present disclosure.

In a second step of the ALD process of FIG. 1B, the first monolayer reacts with a second, oxygen-containing precursor. In one embodiment, the oxygen-containing precursor may be water ($H_2O$). In other embodiments, the oxygen-containing precursor may comprise at least one of hydrogen peroxide ($H_2O_2$), ozone ($O_3$) or oxygen ($O_2$). Further, the oxygen containing precursor may consist of a first oxygen containing precursor and then exposure, optionally after a purge, of a second oxygen containing precursor. After the second half-reaction, excess oxygen-containing precursor and reaction by-product is purged from the system.

FIG. 1B describes a second component of the deposition mechanism, according to one implementation. Described generally, molecular layer deposition (MLD) processes are closely related to ALD processes in being based on sequential, self-limiting surface reactions. However, molecular fragments comprising organic or inorganic constituents are deposited during MLD reactions schemes. In a first step of the MLD process of FIG. 1B, a lithium surface reacts with a first, aluminum-containing precursor to form a first monolayer. In one embodiment, the aluminum-containing precursor may be trimethylaluminum ($Al(CH_3)_3$) (TMA). Other embodiments may utilize similar aluminum-containing precursors as described above in the ALD process of FIG. 1A. After formation of the first monolayer, excess aluminum-containing precursor and reaction by-product is purged from the system.

In a second step of the MLD process of FIG. 1B, the first monolayer reacts with a second, oxygen-containing precursor. In one embodiment, the oxygen-containing precursor may be ethylene glycol ($HOCH_2CH_2OH$). Ethylene glycol is the monomer of polyethylene glycol (PEO), which is a stable polymer with desired ionic conductivity properties and is widely used for solid state electrolyte. In other embodiments, the oxygen-containing precursor may comprise $HO(CH_2)_nOH$, where n is an integer in the range of 3 to 10. In other embodiments, the oxygen-containing precursor may comprise any volatile poly-alcohol molecule. After the second half-reaction, excess oxygen-containing precursor and reaction by-product is purged from the system.

Figure 2A:
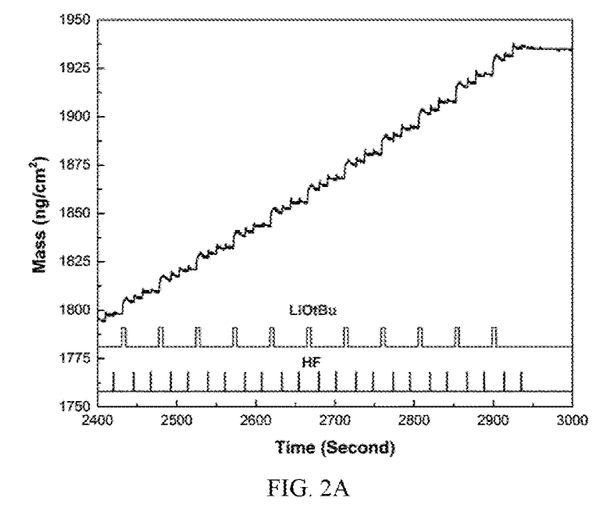
FIG. 2A illustrates in-situ quartz crystal microbalance (QCM) measurements recorded during ALD deposition of LiF using alternating exposures to lithium tert-butoxide (LiOtBu) and hydrogen fluoride (HF) vapors.

In one embodiment, a second ALD process may be conducted to deposit an inorganic metal fluoride portion of a hybrid ALD film. The second ALD process may be conducted after or prior to the ALD process of FIG. 1A. The second ALD process may be conducted after or prior to the MLD process of FIG. 1B. In one embodiment, the second ALD process may be conducted to deposit an inorganic lithium fluoride (LiF) portion of the hybrid ALD film. FIG. 2A illustrates in-situ quartz crystal microbalance (QCM) measurements recorded during the ALD deposition of LiF using alternating exposures to lithium tert-butoxide (LiOtBu) and hydrogen fluoride (HF) vapors. The linear, stepwise increase in mass is consistent with layer-by-layer growth of LiF on the QCM sensor surface, where mass changes are induced by the individual LiOtBu and HF exposures indicated by the pulses at the bottom of FIG. 2A.

Figure 2B:
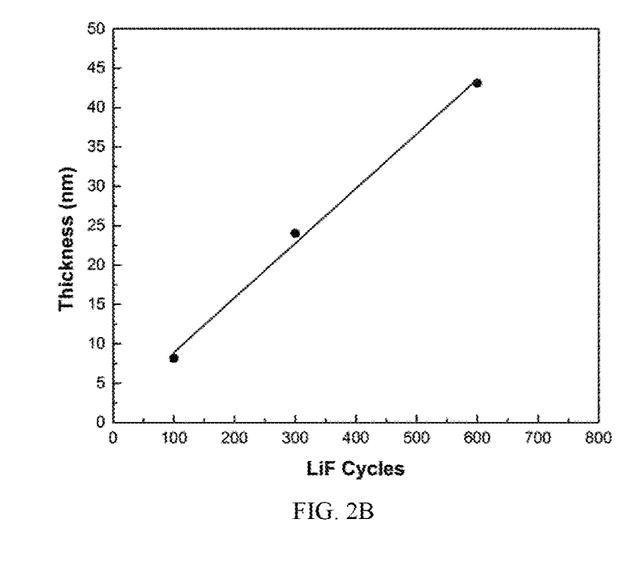
FIG. 2B illustrates thicknesses of films grown after exposure to 100, 300, and 600 cycles of LiF.
Figure 2C:
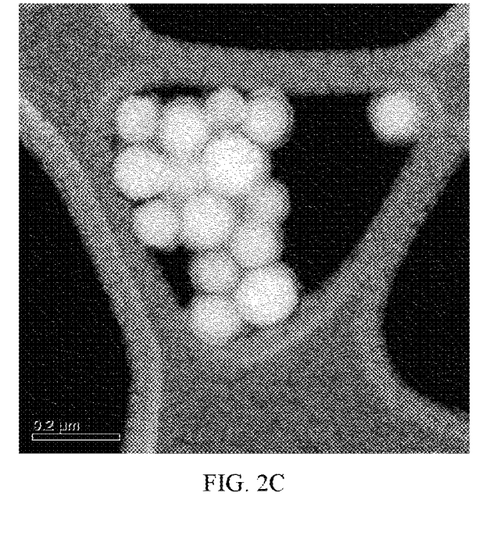
FIG. 2C is a TEM image showing silica nanoparticles (white) layered with ALD-deposited LiF films (grey).

The QCM studies were confirmed by depositing ALD LiF films on silicon substrates and measuring the thickness using spectroscopic ellipsometry. FIG. 2B illustrates thicknesses of films grown after exposure to 100, 300, and 600 cycles of LiF. A near-linear fit curve is added with a slope of 0.08 nm/cycle, or approximately 1 Å/cycle. This growth rate is in agreement with growth rates for other ALD metal fluoride films. Next, ALD LiF was deposited on silica nanoparticles dispersed on a lacey carbon transmission electron microscopy (TEM) grid and subsequently examined using TEM. FIG. 2C is a TEM image showing silica nanoparticles (i.e. white circular features) and the slightly more grey circles surrounding each silica nanoparticle that are the conformal ALD LiF films. The ALD-deposited LiF films also coat the lacey carbon grid, as evidenced by the rough texture of the grid caused by the nanocrystalline morphology of the ALD LiF thin films.

Alternative fluorine sources for ALD metal fluoride films include HF vapor, a solution of HF in $H_2O$, or hydrogen fluoride pyridine (i.e. Olah's reagent). A range of different metal fluorides may be deposited by ALD using volatile compounds of the desired metal for the metal fluoride film. The inorganic component of the hybrid film may be a metal fluoride of Li, Be, B, Mg, Al, Si, Sc, Ti, Mn, Fe, Co, Ni, Cu, Zn, Ga, Sr, Y, Zr, Nb, Mo, In, Sn, Sb, Ba, Ly, Hf, Ta, W, Ce, Pr, Nd, Sm, Eu, Gd. Dy, Ho, Er, Tm, Yb, Lu, or mixtures thereof.

In one embodiment, both ALD deposition and MLD deposition are conducted to constitute a cycle of the lithium protective coating fabrication process. In one embodiment, the ALD process may occur prior to the MLD process. In another embodiment, the ALD process may occur after the MLD process. In yet another embodiment, the ALD process may occur before and after. In one embodiment, at least two cycles are performed to form the protective coating of a predetermined thickness. In one embodiment, the oxygen-containing precursor is independently selected in each cycle. In one embodiment, an even number of cycles are performed. In one embodiment, an odd number of cycles are performed. In one embodiment, the oxygen-containing precursor of each odd cycle comprises at least one of water ($H_2O$), hydrogen peroxide ($H_2O_2$), ozone ($O_3$), or oxygen ($O_2$) and the oxygen-containing precursor of each even cycle comprises ethylene glycol ($HOCH_2CH_2OH$) or $HO(CH_2)_nOH$, where n is an integer in the range of 3 to 10 and the carbon atoms can be arranged linearly or in a branched structure. In one embodiment, the oxygen-containing precursor of each odd cycle comprises ethylene glycol ($HOCH_2CH_2OH$) or $HO(CH_2)_nOH$, where n is an integer in the range of 3 to 10, and the oxygen-containing precursor of each even cycle comprises at least one of water ($H_2O$), hydrogen peroxide ($H_2O_2$), ozone ($O_3$), or oxygen ($O_2$).

In one embodiment, a cycle includes a plurality of ALD depositions followed by at least one MLD deposition (i.e. ABAB . . . AB', ABAB . . . AB'AB' . . . ). In one embodiment, a cycle includes at least one ALD deposition followed by at least one MLD deposition (i.e. ABAB', ABAB'AB' . . . ). In one embodiment, a cycle includes a plurality of MLD depositions followed by at least one ALD deposition (i.e. AB'AB' . . . AB, AB'AB' . . . ABAB . . . ). In one embodiment, a cycle includes at least one MLD deposition followed by at least one ALD deposition (i.e. AB'AB, AB'ABAB . . . ).

In one embodiment, a hybrid protective coating for lithium (Li) anodes includes an organic material and an inorganic material. In one embodiment, the organic material includes alucone and the inorganic material includes alumina. This class of hybrid organic/inorganic material comprising ester groups has excellent compatibility in liquid electrolyte and an enhanced electrolyte wettability. Additionally, a highly crosslinked structure enables various pathways for $Li^+$ diffusion and outstanding solvating properties of $Li^+$ for improved ionic conductivity. Enhanced flexibility and mechanical strength characteristics are also observed.

In one embodiment, the hybrid protective coating on Li may be deposited using a combination of several ALD processes and/or several MLD processes. For instance, lithium aluminum oxide films may be deposited by combining ALD processes for aluminum oxide (first precursor: TMA; second precursor: $H_2O$) and lithium oxide (first precursor: lithium tert-butoxide; second precursor: $H_2O$). The Li concentration in lithium aluminum oxide films is controlled by the relative number of aluminum oxide to lithium oxide ALD cycles performed.

In one embodiment, the ALD processes for depositing lithium aluminum oxide may be combined with MLD processes to form hybrid protective coatings on Li. For example, zincone may be deposited using MLD (i.e. first precursor: diethyl zinc; second precursor: ethylene glycol) to form a hybrid lithium aluminum oxide/zincone film such that the properties thereof are tunable between those of zincone and lithium aluminum oxide.

The ALD and MLD cycles may be combined in various ways. Where TMA is A, diethyl zinc is A', lithium tert-butoxide is C, $H_2O$ is B, and ethylene glycol is B', various combinations of deposition schedules may be performed to optimize film properties and thickness. For example, $(ABCB)_n$ and then $(A'B')_m$, where n and m are positive integers signifying the number of cycles. In this instance, n layers of lithium aluminum oxide (ABCB) are deposited followed by m layers of zincone (A'B'). In general, $(ABCB)_n$ $(A'B')_m$ (or vice versa) may be performed where n and m are any positive number. The thickness of the hybrid protective coating is dictated by the total number of ALD and MLD cycles performed (i.e. m+n) and the composition of the coating is controlled by the ratio of ALD and MLD cycles performed (i.e. m/(m+n)).

In one embodiment, the protective coating has a thickness in the range of 0.1 nm to 100 nm. The hybrid films formed by the methods described herein are extremely conformal and pinhole free and are capable of inhibiting dendrite growth on lithium surfaces, reducing electrolyte consumption, and boosting capacity retention in Li—S batteries. In one embodiment, a protective coating of alucone is deposited on a Li anode using 60 alucone MLD cycles yielding a thickness of ~5 nm and the Li anode is used in a Li—S coin cell battery and subjected to 150 charge-discharge cycles at a C/10 rate. This battery maintained a capacity of about 600 mAh/g compared with a capacity of about 450 mAh/g for similar batteries without alucone coatings. The films are compatible with both liquid and solid state electrolytes.

Moreover, the properties of these hybrid films are easily tuned by choice of precursors and deposition conditions. In one embodiment, ALD deposition cycles may be alternated with MLD deposition cycles (and vice-versa) during film growth to achieve a desired composition and property of the hybrid organic-inorganic film. For example, physical, electronic, and interfacial properties of the hybrid coatings on lithium may be varied and tested by incorporating the coated lithium into Li—Cu and Li—S coin cells. In one embodiment, the hybrid films can be made harder or stiffer by incorporating ALD $Al_2O_3$ (inorganic) with MLD alucone (organic) compositions. In another embodiment, the hybrid films can be made softer by substituting the ethylene glycol ($HOCH_2CH_2OH$) oxygen-containing precursor in the MLD process with a diol having a longer carbon chain. For example, $HO(CH_2)_nOH$ may be used, where n is an integer in the range of 3 to 10.

Alucone films have ester functional groups ($-CH_2CH_2-O-$) and have strong $Li^+$ solvating properties, similar to polyethylene oxide (PEO). The ionic conductivity of alucone can be increased by incorporating lithium using a volatile lithium ALD precursor. The electrical conductivity of the MLD hybrid film can be increased by incorporating ALD ZnO, or decreased by incorporating ALD $Al_2O_3$. The interfacial properties of the hybrid films may be tuned by controlling ALD/MLD chemistry during the initial cycles on the lithium surface, and during the final cycles that form the top film surface that will contact the electrolyte. Interfacial properties are important because they affect the stability of the Li-film interface and the film-electrolyte interface. The failure of metallic Li in rechargable batteries is attributed to unstable interfaces between the Li and the electrolyte. Thus, by tuning the interfacial properties of the film surfaces in contact with Li and with the electrolyte, this problem may be overcome.

The protective coating on the Li may be an inorganic-organic hybrid film. The inorganic component of the hybrid film can be the metal oxide of Li, Be, B, Mg, Al, Si, Sc, Ti, Mn, Fe, Co, Ni, Cu, Zn, Ga, Sr, Y, Zr, Nb, Mo, In, Sn, Sb, Ba, Ly, Hf, Ta, W, Ce, Pr, Nd, Sm, Eu, Gd. Dy, Ho, Er, Tm, Yb, Lu, or mixtures thereof. Alternatively, the inorganic component of the hybrid film can be a metal fluoride of Li, Be, B, Mg, Al, Si, Sc, Ti, Mn, Fe, Co, Ni, Cu, Zn, Ga, Sr, Y, Zr, Nb, Mo, In, Sn, Sb, Ba, Ly, Hf, Ta, W, Ce, Pr, Nd, Sm, Eu, Gd. Dy, Ho, Er, Tm, Yb, Lu, or mixtures thereof. The organic component of the hybrid film can be the metalcone of Li, Be, B, Mg, Al, Si, Sc, Ti, Mn, Fe, Co, Ni, Cu, Zn, Ga, Sr, Y, Zr, Nb, Mo, In, Sn, Sb, Ba, Ly, Hf, Ta, W, Ce, Pr, Nd, Sm, Eu, Gd. Dy, Ho, Er, Tm, Yb, Lu, or mixtures thereof. Furthermore, the metalcone that is the organic component of the hybrid film can comprise esters of ethylene glycol ($HOCH_2CH_2OH$) or $HO(CH_2)_nOH$, where n is an integer in the range of 3 to 10, or esters of branched hydrocarbons having n carbon atoms, where n is an integer in the range of 3 to 10, or mixtures thereof. The metalcone that is the organic component of the hybrid film can comprise esters of any volatile polyalcohol.

Testing

Coulombic Efficiency and Voltage Profile of Li Metal Stripping/Plating on Cu as the Working Electrode For batteries using lithium metal anodes, the Li continuously degrades the liquid electrolyte by parasitic chemical reactions and electrochemical reduction. Rough Li deposition and dendrite growth exacerbate the side reactions because fresh Li metal is exposed during every cycle. Coulombic efficiency (CE), calculated from the amount of lithium deposited onto the anode divided by the amount of lithium stripped in the same cycle, is an effective indicator of side reactions between the Li and electrolyte. Significant parasitic reactions produce a low CE, and vice versa. Thus, CE can also be used to analyze SEI formation and stability. In order to calculate the CE on a cycle-by-cycle basis, we prepared asymmetric Li|Cu coin cells incorporating both bare Li and alucone-coated Li.

Figure 3A:
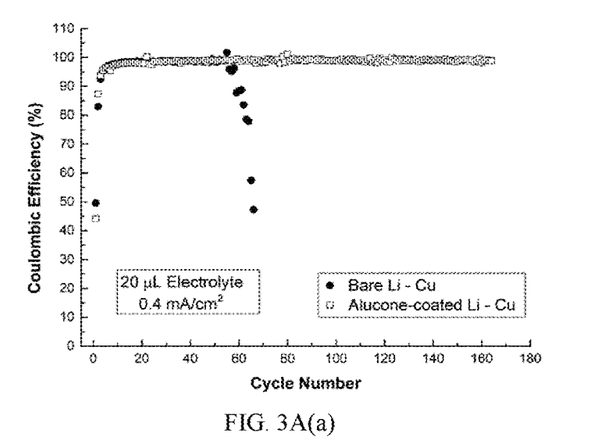

FIG. 3A(a) shows the CE versus charge/discharge cycles using a current rate of 0.4 mA/cm². The CE is low for both cells during the first cycle, due to side reactions between the Li and the electrolyte to form the SEI on both the Li and Cu electrodes. After several cycles, the CE reaches a stable value of about 99.5%. For the bare Li cell, this high CE value is sustained until the 54th cycle when the CE drops rapidly and the cell fails at approximately 60 cycles. This behavior may be attributed to electrolyte consumption by a rough, dendritic Li metal surface. The SEI layer on bare Li is not strong enough to accommodate the volume changes of Li without any host, especially after growth of high modulus lithium dendrites. In contrast, the MLD alucone coating allows the CE of about 99.5% to persist for over 160 cycles, more than 3 times that of uncoated Li. This is because the highly crosslinked structure of the alucone film is sufficiently robust to endure the Li volume changes. Consequently, the SEI is stable, and this prevents rapid electrolyte consumption and promotes uniform and dendrite-free lithium electrodeposition.

To evaluate the effectiveness of MLD alucone protection at high current rates, the Li—Cu cells were cycled at 1.0 mA/cm² (FIG. 3A(b)). Under these conditions, the bare Li fails at only approximately 30 cycles due to worse lithium deposition caused by fast Li stripping/plating in higher current rate. Coulombic efficiency based on alucone-coated Li is about 96% after 10 cycles, with fluctuations appearing between the 10th and 53rd cycles. After this point, the Coulombic efficiency increases to about 98.5% and stabilizes. These fluctuations likely result from the alucone becoming lithiated during cycling, since lithiated alucone is expected to have a higher ionic conductivity than alucone alone. At large current densities, the driving force of lithium diffusion is large. Because of poor ionic conductivity of alucone at room temperature, a partial Li loss is observed within the alucone coating and thus, a relatively low CE. The highly crosslinked structure of the ultrathin alucone film with an ether functional group (—CH$_2$CH$_2$O—) has strong Li$^+$ solvating properties (similar to polyethylene oxide (PEO), [OCH$_2$CH$_2$]$_n$), and can provide various pathways for Li$^+$. In other words, alucones comprising an ether group have strong solvating properties for Li$^+$ to induce ionic conductivity in the amorphous phase, similar to PEO. After alucone is well-lithiated, the ionic conductivity of alucone increases and facilitates the lithium deposition process. The CE increases to a stable value due to little Li loss upon each successive cycle. At such high current rates, greater than 130 cycles were needed to observe failure in the alucone-coated Li, or about 4 times that of bare Li. Therefore, alucone provides excellent protection for lithium metal upon fast charge-discharge processes.

Figure 3B:
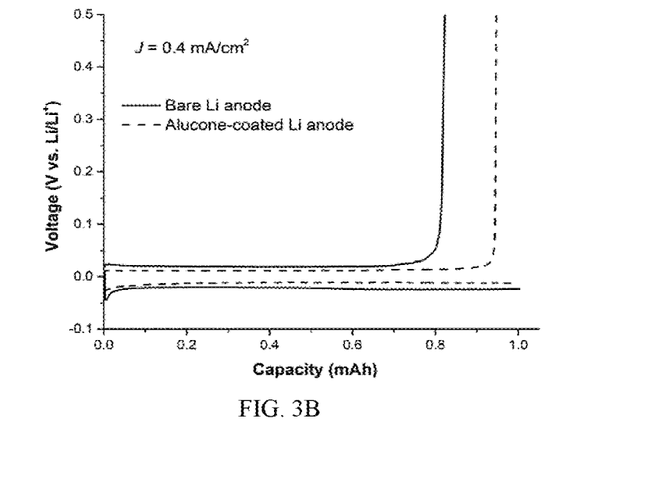
FIG. 3B illustrates voltage profile of Li/Cu and alucone-coated Li/Cu cells at 0.4 mA/cm$^2$ for the second cycle.

The voltage difference (hysteresis) between charge and discharge cycles is plotted to indicate the voltage plateau for lithium stripping and plating, indicating lithium diffusion loss and kinetic reactions upon cycling. FIG. 3B depicts the voltage hysteresis in the second cycle for cells assessed at 0.4 mA/cm². The alucone-coated Li has a much smaller voltage difference (approximately 10 mV) in contrast to bare Li (approximately 20 mV). The result indicates that (1) the highly crosslinked structure of ultrathin alucone film with the ether functional group (—CH$_2$CH$_2$O—) has strong Li$^+$ solvating properties, similar to PEO, and can provide various pathways for Li$^+$ to diffuse and the diffusion rate is adequate at a current rate of 0.4 mA/cm²; (2) Li$^+$ is readily deposited beneath the alucone coating rather than on the top surface causing Li loss and voltage hysteresis; and (3) a larger hysteresis of bare Li is a result of rough SEI formation and uncontrolled lithium deposition after the first cycle and induces sluggish Li$^+$ movements and diffusion loss within the SEI.

Figure 3C:
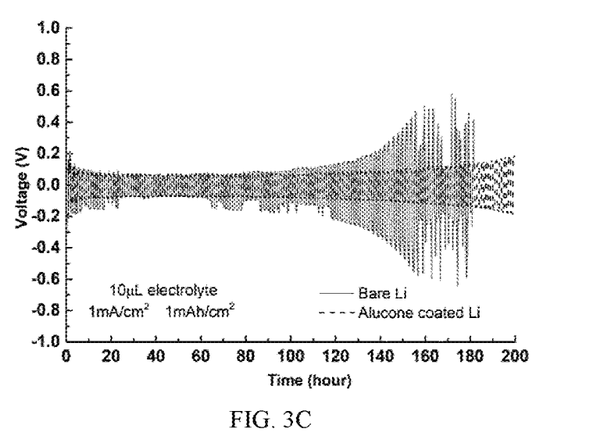
FIG. 3C illustrates Li stripping/plating in different symmetric cells with 10 µL carbonate electrolyte at 1.0 mA/cm$^2$ up to capacity of 1.0 mAh/cm$^2$ (alucone on Li is 6 nm)

Cycling Stability of Li Electrodeposition in Symmetric Cells and SEM Characterization Symmetric, Li|Li coin cells were fabricated with and without alucone coatings to investigate the stability of Li surfaces during sequential stripping/plating cycles. FIG. 3C presents voltage profiles measured at 1.0 mA/cm² to a capacity of 1.0 mAh/cm² using 10 μL electrolyte volume for both the coated and bare Li coin cells. The voltage profile for the alucone-coated Li is more stable versus time compared to the bare lithium. In contrast, the bare lithium shows a higher polarization during the first approximately 10 cycles and the voltage is unstable. These voltage variations result from changes in surface morphology upon Li stripping/plating, which produce a rough and thick solid electrolyte interphase (SEI) that continues to grow with each cycle as fresh Li is exposed. The more stable voltage profile for the alucone-coated Li correlates with a stable and uniform SEI. The overpotential of the bare Li cells increases with testing time, indicating that the impedance increases due to electrolyte consumption and thicker SEI formation. Conversely, the smaller overpotentials for the alucone-coated Li indicate small impedance changes, and that the electrolyte was preserved by the conformal alucone coating and SEI layer. During these measurements, the overpotential of the alucone-coated Li is consistently lower than bare Li, illustrating that the alucone coating creates a stable system for lithium anode operation. Even after the bare lithium failed with short circuit (i.e. a sudden voltage drop at about 158 hours), the alucone protected Li maintained stable operation.

Figure 3D:
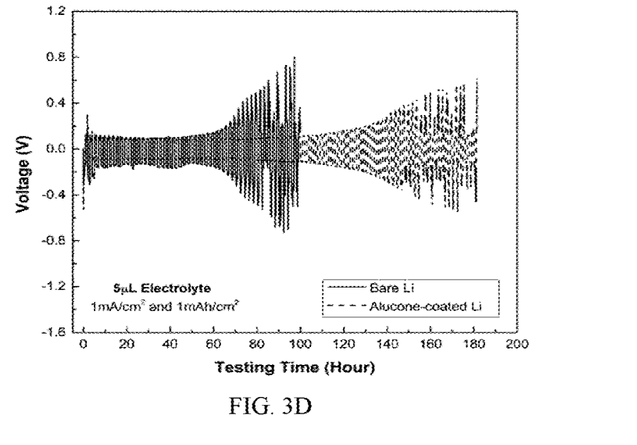
FIG. 3D illustrates Li stripping/plating in different symmetric cells with only 5 µL carbonate electrolyte at 1.0 mA/cm$^2$ up to capacity of 1.0 mAh/cm$^2$.

FIG. 3D investigates the Li stripping/plating performance with and without the alucone coatings as a function of the electrolyte volume. FIG. 3D shows voltage profiles for symmetric cells tested at a current density of 1.0 mA/cm² to a capacity of 1.0 mAh/cm² using 5 μL and 20 μL carbonate electrolyte, respectively. In both cases, the uncoated Li cell begins to exhibit voltage instability much sooner than the alucone-coated Li. In fact, the lifetime of the bare Li cells decreases with decreasing electrolyte volume. This is consistent with cell failure being caused by consumption of the liquid electrolyte. This problem is greatly reduced by the protective alucone coatings, indicating that these coatings reduce the rate of electrolyte consumption.

Figure 3E:
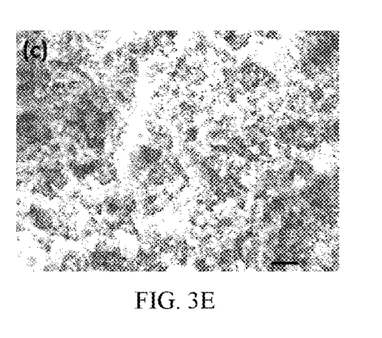
FIG. 3E illustrates an SEM image of Li anode after 50 cycles in Li/Li symmetric cell with 20 µL carbonate electrolyte at 1.0 mA/cm$^2$ up to capacity of 1.0 mAh/cm$^2$.
Figure 3F:
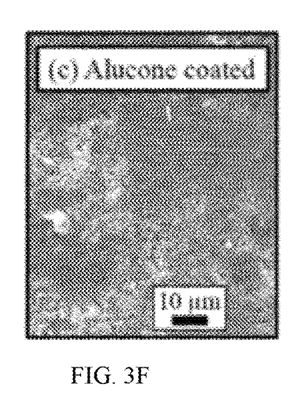
FIG. 3F illustrates an SEM image of alucone-coated Li anode after 50 cycles in alucone-Li/alucone-Li symmetric cell with 20 µL carbonate electrolyte at 1.0 mA/cm$^2$ up to capacity of 1.0 mAh/cm$^2$. Scar bar: 10 µm.

FIGS. 3E and 3F show scanning electron microscope (SEM) images of bare Li metal and alucone-coated Li, respectively, after 50 charge-discharge cycles in symmetric cells. The bare Li surface is extremely rough and porous and shows lithium dendrites (FIG. 3E) while the protected Li is smooth and relatively featureless (FIG. 3F). Therefore, the conformal alucone protects the Li anode even after many cycles at a high current density of 1.0 mA/cm². Moreover, the MLD alucone film promotes planar electrodeposition of the Li without forming dendrites. The 1.0 mAh/cm² charge/discharge capacity corresponds to a movement of about 5 μm Li during each cycle compared to an MLD alucone thickness of only 6 nm. The highly cross-linked MLD film possesses sufficient mechanical strength and flexibility to withstand large and fast volume changes. Alucone-coated Li may also improve the electrolyte wettability that helps with uniform Li stripping/plating processes.

High Mass-Loading Li—S Batteries with Controlled Electrolyte Volume

Figure 3G:
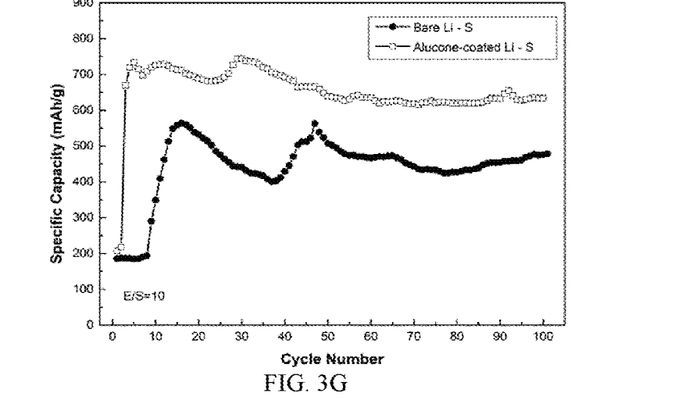
FIG. 3G illustrates cycling performance of Li—S batteries encompassing bare Li or alucone-coated Li with sulfur mass-loading of about 5 mg/cm$^2$ and E/S=10 at 0.1C.

In order to evaluate the performance of alucone-coated lithium in full cells, Li—S batteries were measured with high sulfur loading (approximately 5 mg/cm$^2$). Because electrolyte content in batteries is critical for capacity performance, E/S ratios of 10 and 5 were used satisfying the relationship of E/S being less than 11.1. FIG. 3G shows the cycling performance of bare Li—S and alucone-coated Li—S batteries at a current density of about 1.0 mA/cm$^2$ (corresponding to 0.1 C) with E/S ratio of 10.

From FIG. 3G, the initial capacities for both cells are low because the sulfur electrode is very thick and it takes time for electrolyte to reach the active materials wrapped by carbon nanotubes within the cathode and yield high capacities. After several cycles, capacities drastically increase due to the relocation of active materials well-wetted by electrolyte. The capacities for both cells display fluctuations since the thick sulfur laminates have low electron and ion conductivities. The performances become more stable after about 50 charge-discharge cycles. For the Li—S battery with bare Li, only a capacity of 471.6 mAh/g is retained after 140 cycles, while the alucone protected Li—S battery retained a capacity of 657.7 mAh/g (improvement of 39.5%).

Figure 3H:
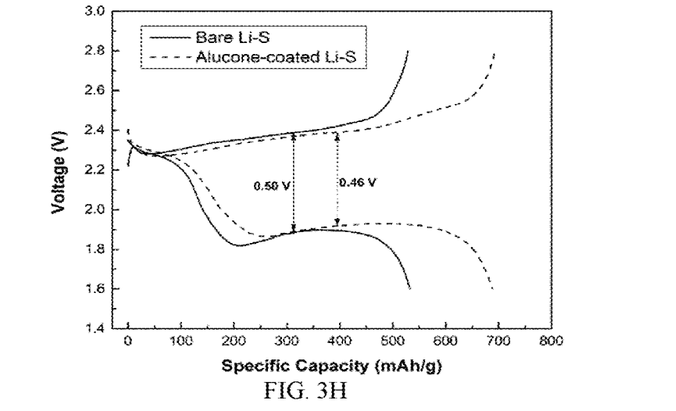
FIG. 3H illustrates a voltage vs. capacity profile at the 20th cycle.
Figure 3I:
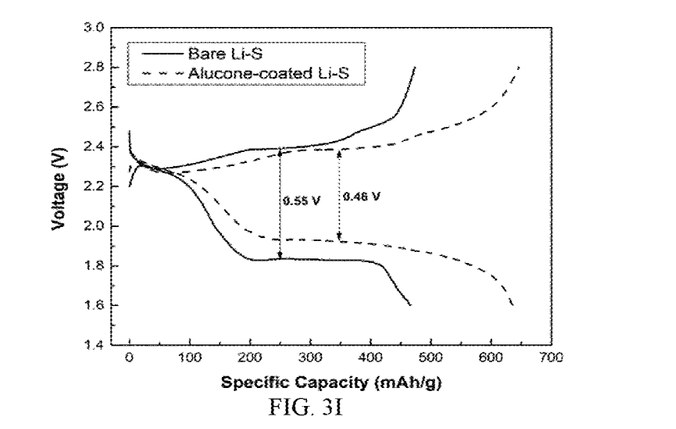
FIG. 3I illustrates a voltage vs. capacity profile at the 60th cycle.

To assess the electrochemical reactions during cycling, voltage-capacity curves for both cells in different cycle stages are shown in FIGS. 3H and 3I. Voltage plateaus in the charge process represent the conversion from lithium sulfide to sulfur, while the two plateaus during the discharge process are related to the change of sulfur to high-order polysulfide ($Li_2S_x$, 4≤x≤8) in voltage of about 2.3 V and the reduction from high-order polysulfide to low-order polysulfide at about 2.1 V.

From FIG. 3H, the second reaction plateaus in the discharge process are at about 1.85 V, much lower than expected at ~2.1 V, suggesting a voltage polarization for both cells is attributed to large resistance in sulfur cathodes. However, a relative small voltage hysteresis (0.46 V) is observed for alucone-coated Li, in comparison to a larger polarization of 0.5 V for bare Li. Given that all testing conditions are the same except for the MLD coating, the larger overpotential for the bare Li results from a thicker SEI and due to more polysulfides deposited on the anode. After 40 more cycles (i.e. the 60th cycle, FIG. 3I), the potential difference between the charge and the discharge processes for the conversion reactions of short-chain polysulfides ($Li_2S_x$, 1≤x≤4) and $Li_2S$ increase to 0.55 V for bare Li. This indicates that the electrochemical reaction for the bare Li is slower due to more SEI and polysulfides deposited on the anode. In comparison, alucone-coated Li stays stable, with little change to the potential difference, suggesting the SEI is maintained well and little polysulfides are deposited onto the SEI which cause resistance overpotential.

Figure 3J:
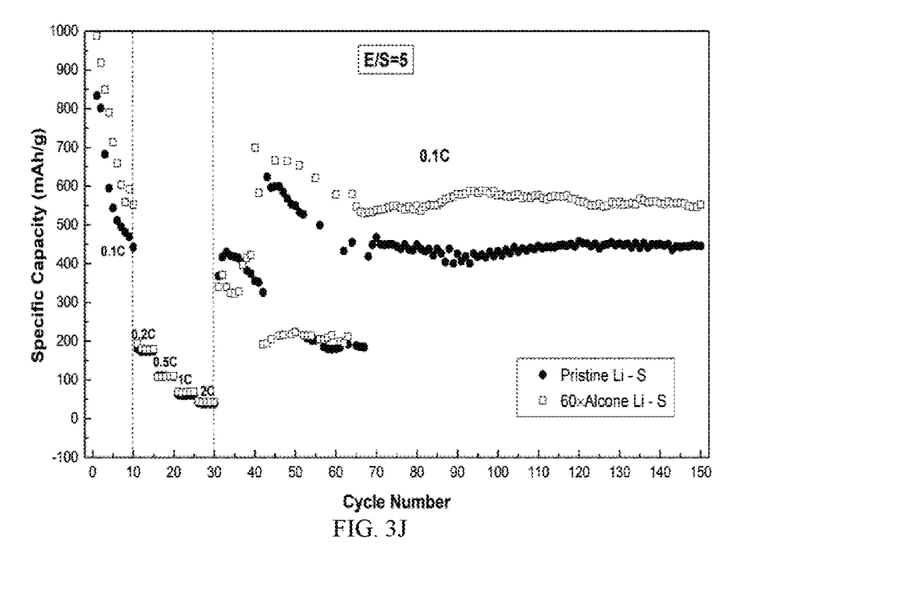
FIG. 3J illustrates a cycling performance of uncoated and coated Li—S batteries with sulfur mass-loading of about 3 mg/cm$^2$ and E/S=5.

Rate performances of Li—S batteries with bare Li or alucone-coated Li were assessed and are exhibited in FIG. 3J. The E/S ratio is decreased to 5 to enhance the energy density of the Li—S batteries. The initial capacity for alucone-coated Li—S battery is 987 mAh/g while the bare Li only gains a specific capacity of 833 mAh/g. The smaller capacity for the bare Li—S cell may be caused by parasitic reactions of polysulfides with bare Li. In the course of measuring at different rates (i.e. from 0.2 C (about 2 mA/cm$^2$) to 2 C (about 20 mA/cm$^2$)), capacity behaviors for both cells are similar due to poor conductivity of the thick sulfur cathodes. Because a current density of 20 mA/cm$^2$ is too large for battery testing, fast lithium ion stripping and plating damages the lithium anode surface and alucone coating. Therefore, after cycling at 2 C, the batteries may become unstable for about 40 cycles thereafter, followed by stable capacities for the two batteries. This is because of reformed SEI layers and relocations of active materials with electrolyte wettability. After 150 cycles, the alucone protected Li—S battery has a capacity of 551 mAh/g and the bare Li—S battery has a capacity of 445 mAh/g. Thus, the alucone protected Li—S battery yields improved performance even after experiencing very high rates.

Molecular layer deposition was used to prepare ultrathin organic/inorganic alucone film on lithium anodes to form conformal, flexible alucone-protected Li that is able to control and minimize undesirable surface reactions and realize more uniform lithium electrodeposition for a stable SEI layer. As exemplified above, the alucone-based coating is able to withstand a cycle life several times longer than bare Li and achieves a steady Coulombic efficiency at a large current density. The coating also realizes low polarization voltage upon lithium stripping/plating in both measurements of Li—Cu cells and Li—S batteries. More significantly, the protected Li yields higher performance in Li—S batteries with a high sulfur mass-loading of about 5 mg/cm$^2$ and low E/S ratio. The alucone protected Li disclosed herein offers an effective avenue for a high performance lithium anode and related applications in high energy density Li—S batteries and other energy storage systems associated with lithium anodes.

Li—Cu Cells: Li-Doped Zincone as a Protective Coating on Lithium

Figure 4:
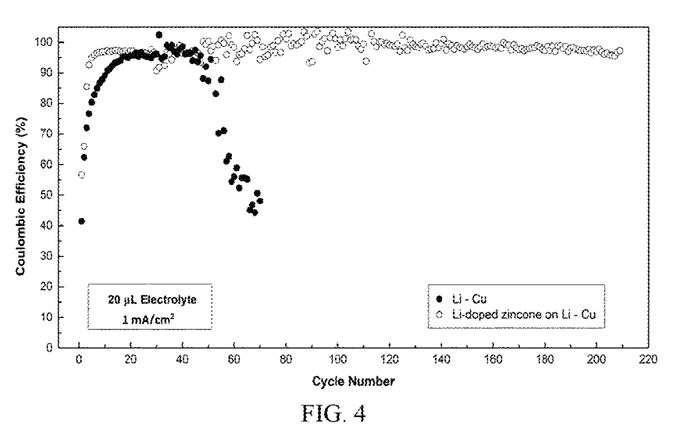
FIG. 4 illustrates Coulombic efficiency (%) versus cycles for lithium metal stripping/plating on copper in coin cells using 20 µL ether electrolyte at 1.0 mA/cm$^2$ using pristine lithium and Li-doped zincone coating on lithium.

FIG. 4 illustrates Coulombic efficiency (%) versus cycles for lithium metal stripping/plating on copper in coin cells using 20 μL ether electrolyte at 1.0 mA/cm$^2$ using pristine lithium and Li-doped zincone coating on lithium. The cycle life with average Coulombic efficiency exceeding 96% of Li-doped zincone protected Li is about 4 times longer than that of bare Li. Lithium anodes used in the cells are bare lithium foil for the Li—Cu cell (black solid dots) and Li-doped zincone coated Li foil for a second cell (present in black hollow dots). The lithium ratio may be changed by cycles of LTB/EG.

Li—Cu Cells: Lithium Fluoride (LiF) as a Protective Coating on Lithium

Figure 5:
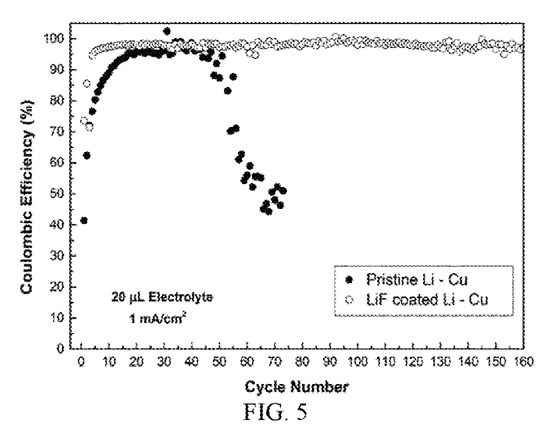
FIG. 5 illustrates Coulombic efficiency (%) versus cycles for lithium metal stripping/plating on copper in coin cells using 20 µL ether electrolyte at 1.0 mA/cm$^2$ using pristine lithium and LiF-coated on lithium.

FIG. 5 illustrates Coulombic efficiency (%) versus cycles for lithium metal stripping/plating on copper in coin cells using 20 μL ether electrolyte at 1.0 mA/cm$^2$ using pristine lithium and LiF-coated on lithium. The cycle life with average Coulombic efficiency exceeding 97.5% of LiF protected Li is about 4 times longer than that of bare Li. Lithium anodes used in the cells are bare lithium foil for the Li—Cu cell (black solid dots) and lithium fluoride (LiF) coated Li foil for a second cell (present in black hollow dots).

The present disclosure describes hybrid protective coatings for lithium metal surfaces and methods of fabrication thereof using atomic layer deposition (ALD) and molecular layer deposition (MLD). The resultant hybrid organic-inorganic layers are pinhole- and defect-free at the nanometer level such that the effects on impedance and gravimetric/volumetric capacity are minimal. Moreover, the films are capable of protecting the lithium surface during cycling such that lithium anode lifetimes may be extended by up to 300%.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

References herein to the positions of elements (i.e. "top," "bottom," "above," "below," "on," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed:

1. A method for forming protective coatings on lithium (Li) anodes, comprising:
    (a) reacting a Li surface with an aluminum-containing precursor or a first zinc-containing precursor to form a first monolayer;
    (b) purging excess aluminum-containing precursor or first zinc-containing precursor and reaction by-product;
    (c) reacting the first monolayer with a first oxygen-containing precursor selected from the group consisting of water ($H_2O$), ozone ($O_3$), and oxygen ($O_2$);
    (d) purging excess first oxygen-containing precursor and reaction by-product;
    wherein steps (a) to (d) constitute a first cycle that forms a film of a first material on the Li surface;
    (e) reacting the film of the first material with a second zinc-containing precursor to form a second monolayer;
    (f) purging excess second zinc-containing precursor and reaction by-product;
    (g) reacting the second monolayer with a second oxygen-containing precursor comprising $HO(CH_2)_nOH$, where n is an integer in the range of 2 to 10;
    (h) purging the second oxygen-containing precursor and a second reaction by-product;
    wherein steps (e) to (h) constitute a second cycle that forms a zincone film on the film of the first material;
    (i) reacting the zincone film with a Li-containing precursor to form a third monolayer
    (j) purging excess Li-containing precursor and a third reaction by-product;
    (k) reacting the third monolayer with a third oxygen-containing precursor selected from the group consisting of water ($H_2O$) and $HO(CH_2)_nOH$, where n is an integer in the range of 2 to 10;
    (l) purging the third oxygen-containing precursor and reaction by-product;
    wherein steps (i) to (l) constitute a third cycle that forms a film of Li-containing material on the zincone film such that the protective coating comprises a first material/zincone/Li-containing material film having a thickness.

2. The method of claim 1, wherein the aluminum-containing precursor comprises at least one of trimethylaluminum ($Al(CH_3)_3$) (TMA), triethylaluminum (($C_2H_5)_3Al$) (TEA), triethyl(tri-sec-butoxy)dialuminum (($C_2H_5)_3Al_2(OC_4H_9)_3$), aluminum chloride ($AlCl_3$), aluminum isopropoxide ($Al((OCH(CH_3)_2)_3)$), dimethylaluminum isopropoxide (($CH_3)_2AlOCH(CH_3)_2$), tris(2,2,6,6-tetramethyl-3,5-heptanedionato)aluminum ($Al(TMHD)_3$), tri-isobutylaluminum (($C_4H_9)_3Al$), aluminum hexafluoroacetylacetonate ($Al(CF_3COCHCOCF_3)_3$), aluminum ethoxide ($Al(OC_2H_5)_3$), aluminum s-butoxide ($Al(OC_4H_9)_3$), or aluminum acetylacetonate ($Al(CH_3COCHCOCH_3)_3$).

3. The method of claim 1, wherein an even number of cycles of the first cycle, the second cycle and/or the third cycle are performed.

4. The method of claim 3, wherein an odd number of cycles of the first cycle, the second cycle and/or the third cycle are performed.

5. The method of claim 1, wherein the protective coating has a thickness in the range of 1 nm to 10 nm.

6. The method of claim 1, wherein each of the first zinc-containing precursor and the second zinc-containing precursor comprises diethyl zinc.

7. The method of claim 1, wherein the Li surface is reacted with the aluminum containing precursor such that the first material comprises alumina or lithium doped alumina.

8. The method of claim 1, wherein the Li surface is reacted with the first zinc containing precursor such that the first material comprises zinc oxide or lithium doped zinc oxide.

9. The method of claim 1, wherein the Li-containing precursor comprises lithium tert-butoxide.

* * * * *